United States Patent [19]

Miyashita

[11] Patent Number: 4,458,290
[45] Date of Patent: Jul. 3, 1984

[54] CIRCUIT FOR CONTROLLING A D.C. ELECTROMAGNETIC BRAKE

[75] Inventor: Hideo Miyashita, Hino, Japan

[73] Assignee: Fujitsu Fanuc Limited, Tokyo, Japan

[21] Appl. No.: 387,882

[22] PCT Filed: Oct. 14, 1981

[86] PCT No.: PCT/JP81/00282
  § 371 Date: Jun. 8, 1982
  § 102(e) Date: Jun. 8, 1982

[87] PCT Pub. No.: WO82/01450
  PCT Pub. Date: Apr. 29, 1982

[30] Foreign Application Priority Data
  Oct. 14, 1980 [JP] Japan .................. 55-142358

[51] Int. Cl.$^3$ .......................... H01H 47/32
[52] U.S. Cl. ..................... 361/152; 361/175
[58] Field of Search ............ 361/2, 13, 91, 101, 361/110, 111, 139, 160, 152, 159, 173, 175, 156

[56] References Cited

U.S. PATENT DOCUMENTS 3,767,978 10/1973 Wernli .................. 361/175
4,250,531 2/1981 Ahrens .................. 361/2

OTHER PUBLICATIONS

"Transient Voltage Suppression Manual"-General Electric- ©1976.

Primary Examiner—Harry E. Moose, Jr.
Attorney, Agent, or Firm—Armstrong, Nikaido, Marmelstein & Kubovcik

[57] ABSTRACT

A circuit for controlling a D.C. electromagnetic brake, in which a series circuit consisting of a solenoid 35 for the electromagnetic brake and a transistor 52 for controlling the current that flows into the solenoid is connected to a D.C. power source 8 and wherein a varistor 4 is connected in parallel between the emitter and the collector of the transistor 52 which controls current that flows into the solenoid, in order to clamp the counter electromotive force that generates across the emitter and the collector of the transistor when the current flowing through the solenoid is interrupted.

1 Claim, 5 Drawing Figures

CIRCUIT FOR CONTROLLING A D.C. ELECTROMAGNETIC BRAKE

DESCRIPTION

The present invention relates to a circuit for controlling a D.C. electromagnetic brake, more specifically to a circuit for controlling a D.C. electromagnetic brake by using a transistor which controls the electric current flowing through a solenoid.

BACKGROUND OF THE INVENTION

In robots for industrial applications, a D.C. electromagnetic brake as illustrated in FIG. 1 has heretofore been employed for a mechanism which pulls up or lowers heavy articles.

The D.C. brake 3 shown in FIG. 1 consists of a brake housing 31 secured to a robot frame 1, a brake disc 32 fastened to a feed screw 2, an armature disc 33 disposed facing the brake disc 32, a spring 34 which works to press the armature disc 33 onto the brake disc 32, and a brake coil 35 which works to pull the armature disc 33 away from the brake disc 32. When the brake coil 35 is not energized, the armature disc 33 is pressed onto the brake disc 32 being urged by the spring 34, whereby the feed screw 2 is fastened to the robot frame 1 via brake 3. When the brake coil 35 is energized, on the ohter hand, a magnetic force is established between a yoke 36 provided around the brake coil 35 and the armature disc 33. The armature disc 33 is therefore pulled away from the brake disc 32, the braking function is released, and the feed screw is allowed to rotate freely.

The control circuit illustrated in FIG. 2 has hitherto been used to control the operation of the D.C. electromagnetic brake of FIG. 1. In the circuit of FIG. 2, a brake coil for the D.C. electromagnetic brake and a transistor 5' for controlling the current flowing through the brake coil are connected in series across the terminals of a D.C. power source 8'. The base of the transistor 5' which controls the current is connected to the output terminal of a transistor driver circuit 7'.

In the circuit of FIG. 2, a circuit 6' for restraining the counter electromotive force is connected in parallel with the brake coil in order to prevent the transistor 5' from being damaged by the counter electromotive force that generates across the terminals of the brake coil when the supply of current is interrupted. A circuit consisting of a resistor and a capacitor connected in series may be used as the circuit 6' for restraining the counter electromotive force. This, however, is not sufficient to absorb the counter electromotive force. Further, a diode may be used as the circuit 6' for restraining the counter electromotive force. The diode is capable of absorbing the counter electromotive force, but requires an extended period of time before the current flowing through the brake coil is completely interrupted, and causes the operation to become unstable. It has also been proposed to use a varistor having a suitable operation voltage to form the circuit 6' for restraining the counter electromotive force. FIG. 3 shows operation waveforms of the transistor which controls the flow of current, and FIG. 4 shows voltage vs. current characteristics of the varistor which is employed. As shown in FIG. 3, when the transistor 5' is conductive and the current is flowing into the brake coil, the voltage across the collector and emitter of the transistor 5' is nearly zero. When the transistor 5' is shifted from the conductive state to the nonconductive state in response to a signal from the transistor driver circuit 7', the voltage across the collector and emitter of the transistor 5' rises suddenly, reaches the power source voltage Vs, and then becomes greater than Vs due to the counter electromotive force generated across the coil. However, the counter electromotive force generated across the coil is limited by a conductive voltage Va of the varistor, and, hence, the voltage across the collector and the emitter of the transistor 5' is permitted to rise up to Vs+Va. The voltage across the collector and the emitter, which is clamped to the above-mentioned value, decreases with the decrease in the counter electromotive force of the coil and remains stable at the power source voltage Vs. Therefore, the operation time of the brake is reduced or, in other words, the braking operation is stabilized.

In the above-mentioned circuit, however, the conductive voltage Va of the varistor must be greater than the voltage which is applied to the brake coil and must, hence, be greater than the power source voltage Vs. Therefore, the transistor 5' must have a rated voltage which is two or more times as great as the power source voltage. However, transistors having such a high rated voltage are expensive and are not readily available.

SUMMARY OF THE INVENTION

In view of the problems inherent in the conventional art, the principal object of the present invention is to provide a cheaply constructed and highly reliable circuit for controlling a D.C. electromagnetic brake, which makes use of a transistor having a relatively low rated voltage and which stably controls the braking within relatively short periods of operation time when the current is interrupted.

In accordance with the present invention, there is provided a circuit for controlling a D.C. electromagnetic brake comprising a series connected circuit consisting of a solenoid for said D.C. electromagnetic brake and a transistor for controlling the current flowing through said solenoid, said series connected circuit being connected across a D.C. power source, and a varistor connected in parallel between the emitter and the collector of said transistor, wherein the counter electromotive force generated between the emitter and the collector of the transistor upon interruption of the current flowing through said solenoid is clamped.

BEST MODE FOR CARRYING OUT THE INVENTION

Figure 5:
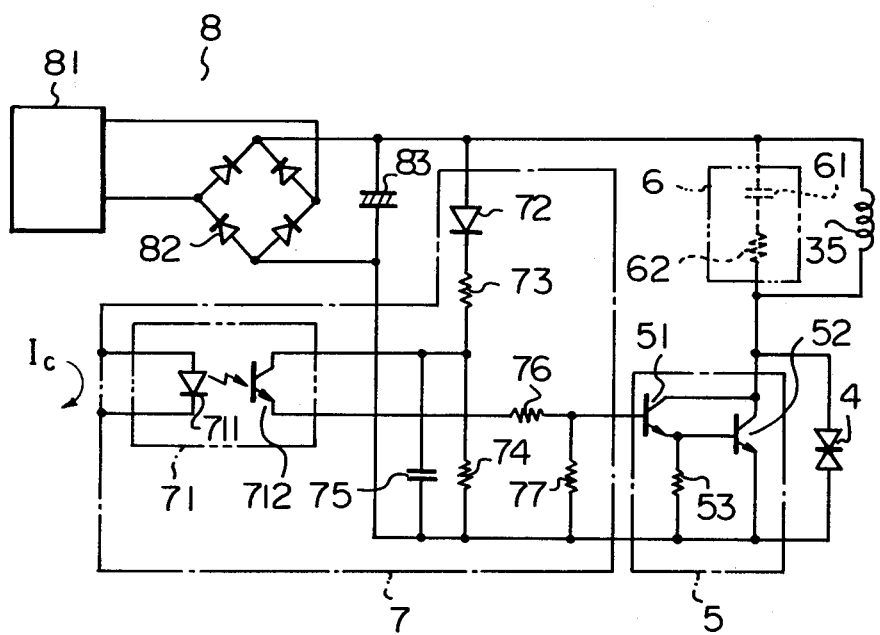
FIG. 5 is a diagram of a circuit for controlling the D.C. electromagnetic brake according to an embodiment of the present invention.

FIG. 5 shows a circuit for controlling a D.C. electromagnetic brake according to an embodiment of the present invention. In FIG. 5, a series circuit consisting of a brake coil 35 and a transistor circuit 5 for controlling the current is connected across the output terminals of a D.C. power source circuit 8. The transistor circuit 5 for controlling the current is controlled by a transistor driver circuit 7. A varistor 4 is connected in parallel with the transistor circuit 5 which controls the current and which consists of two transistors 51, 52 that are Darlington-connected. In the transistor driver circuit 7, a diode 72 and resistors 73, 74 are connected in series across the terminals of the D.C. power source 8. A capacitor 75 is connected in parallel with the resistor 74. A transistor drive command signal is supplied to the transistor drive circuit 7 via a photocoupler 71 and, hence, is insulated from the power source circuit which drives the D.C. electromagnetic brake. The point at which the resistors 73, 74 are connected together is connected to a base terminal of the transistor circuit 5 which controls the current, via a transistor circuit 712 in the photocoupler 71 and a resistor 76. The base terminal of the transistor circuit 5 which controls current is further connected, via a resistor 77, to a reference voltage side of the D.C. power source. As required, a noise-preventing circuit 6 is connected in parallel with the brake coil 35. In the D.C. power source circuit 8, A.C. voltage waveforms from an A.C. power source 81 are rectified through a fullwave rectifier bridge 82 and are smoothed by a smoothing capacitor 83.

Figure 1:
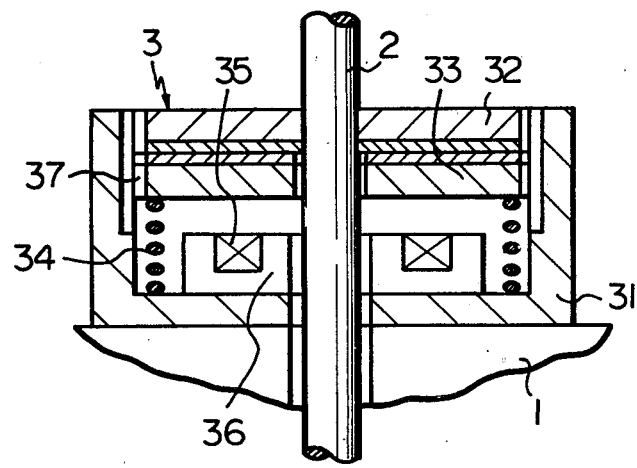
FIG. 1 is a diagram schematically illustrating the construction of a D.C. electromagnetic brake which is employed for the robots.
Figure 2:
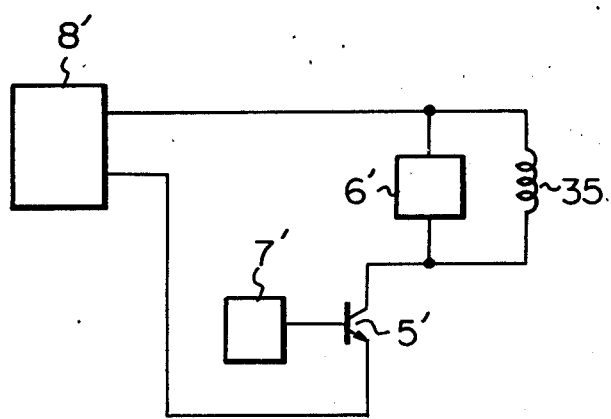
FIG. 2 is a diagram of a conventional control circuit used for controlling the D.C. electromagnetic brake of FIG. 1.
Figure 3:
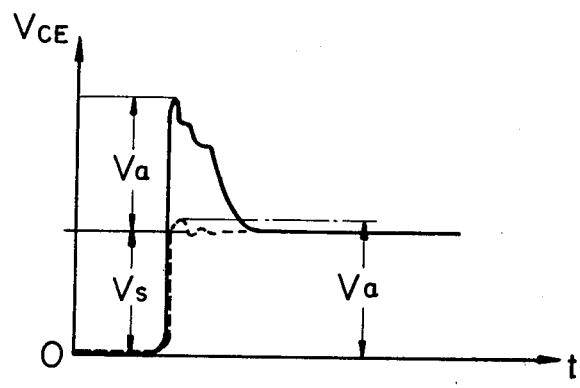
FIG. 3 is a diagram of waveforms illustrating the characteristics of the circuit of FIG. 2.
Figure 4:
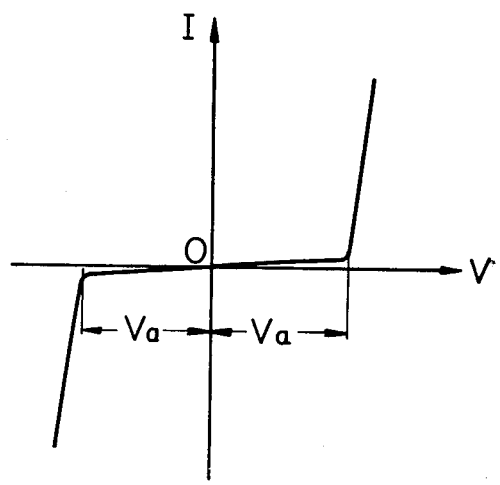
FIG. 4 is a diagram showing voltage vs. current characteristics of a varistor which is employed for the circuit of FIG. 2.

The operation of the circuit of FIG. 5 is described below: when a command current Ic is being supplied to a photodiode circuit 711 in the photocoupler 71, the transistor circuit 712 in the photocoupler 71 is rendered conductive. Therefore, a drive current is supplied from the connection point between the resistors 73 and 74 to the base terminal of the transistor circuit 5 which controls current, via the transistor circuit 712 and the resistor 76. Accordingly, the first transistor 51 in the transistor circuit 5 is rendered conductive to supply a base current to the second transistor 52, whereby a path between the collector and the emitter of the second transistor 52 is rendered conductive, and an electric current is permitted to flow into the brake coil. In this case, the voltage Vce across the collector and the emitter of the second transistor 52 remains almost zero. The broken line in the diagram of voltage waveform of FIG. 3 shows the change in the voltage Vce across the collector and the emitter of the second transistor 52 when the transistor circuit 5 for controlling current is shifted from the conductive state to the nonconductive state. When the supply of command current Ic is interrupted, the photodiode 712 is rendered nonconductive, and the base current is no longer supplied to the transistor circuit 5 which controls current. Consequently, the voltage across the collector and the emitter of the transistor 52 suddenly increases. In this case, since the current flowing through the brake coil 35 decreases, a counter electromotive force is generated across the brake coil 35. Due to the counter electromotive force, the voltage across the collector and the emitter rises in excess of the power source voltage Vs, but is clamped by the conductive voltage Va of the varistor 4 which is connected in parallel across the collector and the emitter of the transistor 52. After having reached the conductive voltage Va, the voltage across the collector and the emitter of the transistor 52 quickly decreases and stably remains at the power source voltage Vs.

As mentioned above, even when the current is interrupted, the voltage Vce across the collector and the emitter of the transistor circuit 5 does not become greater than a value limited by the conductive voltage Va of the varistor 4. The conductive voltage Va has to be slightly greater than the power source voltage Vs. Accordingly, the transistor circuit 5 for controlling current has to have a rated voltage which is slightly greater than the power supply voltage Vs.

According to the present invention, there is provided a cheaply constructed and highly reliable circuit for controlling the D.C. electromagnetic brake, which stably effects control within a relatively short period of operation time when the current is interrupted, by using a transistor having a relatively small rated voltage across the collector and the base.

I claim:

1. A circuit for controlling a D.C. electromagnetic brake comprising:
    first and second D.C. power source terminals;
    a solenoid, connected to said first D.C. power source terminal, for driving said D.C. electromagnetic brake;
    a Darlington circuit, including first and second transistors connected between said solenoid and said second D.C. power source terminal for controlling the current flowing through said solenoid;
    a varistor connected in parallel to said second transistor of said Darlington circuit;
    a driver circuit, connected between said first and second D.C. terminals, for driving said Darlington circuit, said driver circuit comprising a series circuit formed by a diode, and first and second resistors, and comprising a capacitor connected in parallel to said second resistor;
    a photocoupler connected to the connection point of said first and second resistors of said driver circuit and to said first transistor of said Darlington circuit, for receiving a drive command signal to turn on said Darlington circuit; and
    a noise suppressor circuit, connected in parallel to said solenoid, said noise suppressor circuit comprising a capacitor and a third resistor connected in series.

* * * * *